US009515660B1

(12) United States Patent
Samson et al.

(10) Patent No.: US 9,515,660 B1
(45) Date of Patent: Dec. 6, 2016

(54) SINGLE-ENDED CONTENTION-FREE WIDE OPERATING RANGE LEVEL VOLTAGE SHIFTER WITH BUILT-IN VOLTAGE BOOSTING AND DOWN-STEPPING ASSISTING CIRCUITRY

(71) Applicant: QUALCOMM Incorporated, San Diego, CA (US)

(72) Inventors: Giby Samson, San Diego, CA (US); Yu Pu, San Diego, CA (US); Kendrick Hoy Leong Yuen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/843,992

(22) Filed: Sep. 2, 2015

(51) Int. Cl.
*H03K 19/0185* (2006.01)
*H03K 17/687* (2006.01)

(52) U.S. Cl.
CPC .. *H03K 19/018507* (2013.01); *H03K 17/6871* (2013.01)

(58) Field of Classification Search
CPC .............. H03K 19/0175; H03K 19/017509; H03K 19/0185; H03K 19/018507; H03K 19/018521
USPC ............. 326/62, 63, 68, 80, 81; 327/333
See application file for complete search history.

(56) References Cited

U.S. PATENT DOCUMENTS

| | | | |
|---|---|---|---|
| 5,241,502 A * | 8/1993 | Lee | G11C 5/145 326/88 |
| 5,786,711 A * | 7/1998 | Choi | H03K 19/0016 326/17 |
| 6,853,234 B2 | 2/2005 | Bucossi | |
| 7,183,832 B1 | 2/2007 | Voo | |
| 7,230,469 B2 | 6/2007 | Benzer et al. | |
| 7,449,918 B2 | 11/2008 | Yamahira et al. | |
| 7,468,615 B1 | 12/2008 | Tan et al. | |
| 7,671,657 B1 | 3/2010 | Chen et al. | |
| 7,750,718 B2 | 7/2010 | Kim | |
| 8,629,707 B1 | 1/2014 | Sanchez et al. | |
| 2007/0170465 A1* | 7/2007 | Kwon | H03K 19/018528 257/197 |

OTHER PUBLICATIONS

Moghaddam M., et al., "A Low-Voltage Single-Supply Level Converter for Sub-VTH /Super-VTH Operation: 0.3V to 1.2V", International Journal of Computer Applications, May 2013, vol. 69, No. 2, pp. 14-18.
Nooters S.N., et al., "An Energy-Efficient Subthreshold Level Converter in 130-nm CMOS", IEEE Transactions on circuits and Systems-II: Express Briefs, Apr. 2010, vol. 57, No. 4, pp. 290-294.
(Continued)

*Primary Examiner* — William Hernandez
(74) *Attorney, Agent, or Firm* — Muncy, Geissler, Olds & Lowe, P.C.

(57) ABSTRACT

A voltage level shifter to provide an output logic signal in response to an input logic signal, where the input logic signal is in a first voltage domain and the output logic signal is in a second voltage domain. In one embodiment, a voltage boost module provides a boosted voltage in response to the input logic signal going HIGH, where the boosted voltage is sufficient to turn OFF a pull-up transistor operating in the second voltage domain. Contention among pull-down and pull-up transistors may be avoided.

25 Claims, 10 Drawing Sheets

(56) References Cited

OTHER PUBLICATIONS

Zhou J., et al., "A Fast and Energy-Efficient Level Shifter with Wide Shifting Range from Sub-threshold up to I/O Voltage", Asian Solid-State Circuits Conference (A-SSCC), IEEE, Nov. 2013, pp. 137-140.

* cited by examiner

SINGLE-ENDED CONTENTION-FREE WIDE OPERATING RANGE LEVEL VOLTAGE SHIFTER WITH BUILT-IN VOLTAGE BOOSTING AND DOWN-STEPPING ASSISTING CIRCUITRY

FIELD OF DISCLOSURE

Embodiments pertain to electronic circuits, and more particularly, to voltage level shifter circuits.

BACKGROUND

In many electronic systems, it is desirable to reduce the supply voltage in digital logic circuits so as to reduce power consumption and thermal heating. However, such low voltage circuits may need to interface with other circuits operating in a different voltage domain. A voltage level shifter provides an interface between two voltage domains. For example, a first voltage domain may operate in which the logic signals take on either the voltage $V_{SS}$, sometimes referred to as the substrate voltage or ground, and a first supply voltage, $V_{DDL}$; and a second voltage domain may operate in which the logic signals take on either the voltage $V_{SS}$ or a second supply voltage, $V_{DDH}$, where $V_{DDH}$ is greater than $V_{DDL}$. A voltage level shifter receives as input a logic signal in the first voltage domain, and provides as output a logic signal in the second voltage domain where the output logic signal follows the input logic signal.

A large class of voltage level shifters makes use of a cross coupled latch. FIG. 1A illustrates a conventional cross-coupled voltage level shifter. An input logic signal is provided to the input port 110, and the output port 130 provides an output logic signal. The input logic signal is in a first voltage domain with HIGH voltage $V_{CCL}$ and LOW voltage $V_{SS}$, and the output logic signal is in a second voltage domain with HIGH voltage $V_{CCH}$ and LOW voltage $V_{SS}$. The output of the driver 120 is coupled to the gate of the nMOSFET (Metal-Oxide-Semiconductor-Field-Effect-Transistor) 122, and the gate of the nMOSFET 124 is at $V_{CCL}$. The differential pair of transistors 122 and 124 is coupled to the cross coupled pMOSFETs 126 and 128. The cross coupled transistors 126 and 128 have their source terminals connected to the $V_{CCH}$ power rail, and the output port 130 is taken at the drain of the transistor 122.

The transistors 128 and 126 are sized to be relatively weak compared to the other transistors. The ratios of transistor sizes are chosen to ensure proper operation. Operation of the cross-coupled voltage level shifter of FIG. 1A is well known and need not be described in detail. However, it is to be noted that as the input logic signal transitions from HIGH ($V_{CCL}$) to LOW ($V_{SS}$) or from LOW ($V_{SS}$) to HIGH ($V_{CCL}$), there is contention among the cross coupled pMOSFETs 126 and 128 and their respectively coupled nMOSFETs 122 and 124. This inherent contention issue arises irrespective of the shifting range $V_{CCH}$-$V_{CCL}$ as long as $V_{CCH}$ is greater than $V_{CCL}$, but the contention problem becomes more severe as the shifting range $V_{CCH}$-$V_{CCL}$ becomes greater, and is particularly worsened if $V_{CCL}$ is near the transistor threshold voltage.

As a result, the output logic signal of a conventional voltage level shifter may be distorted, and the output logic signal may ultimately stop toggling all together as the maximum input logic signal voltage decreases further. FIG. 1B provides an example of the input and output logic signals for the circuit of FIG. 1A, where in FIG. 1B the input logic signal is denoted as "IN" and the output logic signal is denoted as "OUT". (FIGS. 1A and 1B are disclosed in U.S. Pat. No. 6,677,798 B2, and are representative of conventional voltage level shifters with cross-coupled pMOSFETs.) Determining the appropriate ratio of the transistors to ensure reliable functioning and good timing behavior across all PVT (Process-Voltage-Temperature) corners can be a challenge.

SUMMARY

Embodiments of the invention are directed to systems and methods for level voltage shifting with built-in voltage boosting and down-stepping assisting.

An embodiment includes a voltage level shifter having a boosted node having a voltage, an input port to receive an input logic signal in a first voltage domain, and an output port to provide an output logic signal in a second voltage domain in response to the input logic signal. The voltage level shifter further includes: a voltage boost module coupled to the boosted node to boost the voltage of the boosted node when the input logic signal transitions from a LOW voltage to a first HIGH voltage in the first voltage domain; a node discharge module coupled to the boosted node to discharge the boosted node for a time interval when the input logic signal transitions from the first HIGH voltage to the LOW voltage; and a pull-up module coupled to the boosted node, the boosted node to turn OFF the pull-up module when boosted by the voltage boost module, wherein the pull-up module operates in the second voltage domain.

Another embodiment includes a method to provide a voltage level shift. The method includes: boosting voltage at a boosted node by a pre-charge voltage in response to an input signal going from LOW to HIGH in a first voltage domain; discharging the boosted node for a time interval in response to the input signal going from HIGH to LOW in the first voltage domain while the input signal is LOW; charging the boosted node with a pre-charge module; reducing the effect of the pre-charge module in response to the input signal going from HIGH to LOW in the first voltage domain while the input signal is LOW; and pulling up an internal node to a HIGH voltage in a second voltage domain in response to boosting voltage at the boosted node to the pre-charge voltage.

Another embodiment includes a system to provide a voltage level shift. The system includes: means for boosting voltage at a boosted node by a pre-charge voltage in response to an input signal going from LOW to HIGH in a first voltage domain; means for discharging the boosted node for a time interval in response to the input signal going from HIGH to LOW in the first voltage domain while the input signal is LOW; means for charging the boosted node with a pre-charge module; means for reducing the effect of the pre-charge module in response to the input signal going from HIGH to LOW in the first voltage domain while the input signal is LOW; and means for pulling up an internal node to a HIGH voltage in a second voltage domain in response to boosting voltage at the boosted node to the pre-charge voltage.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1A:
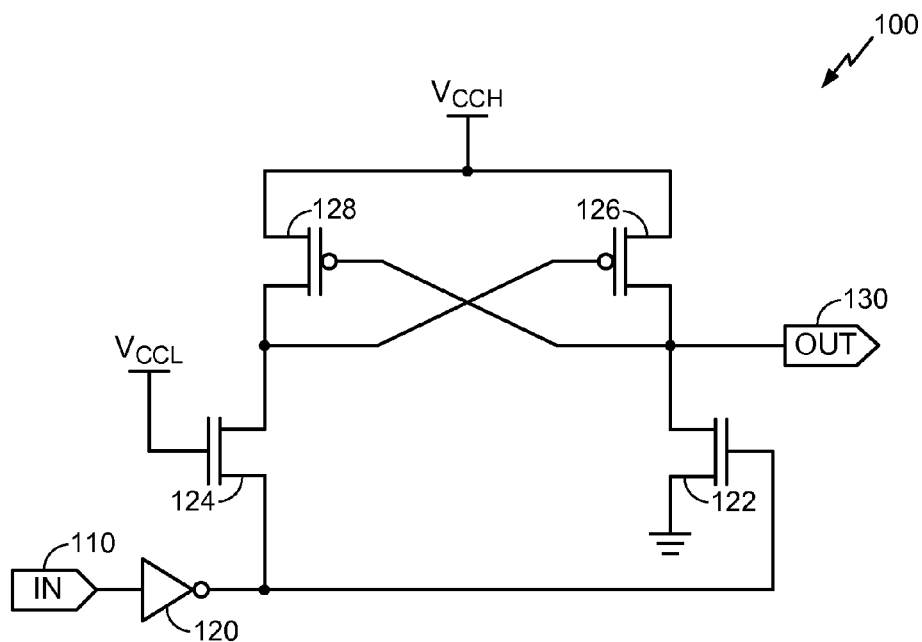
FIG. 1A is a prior art voltage level shifter.
Figure 1B:
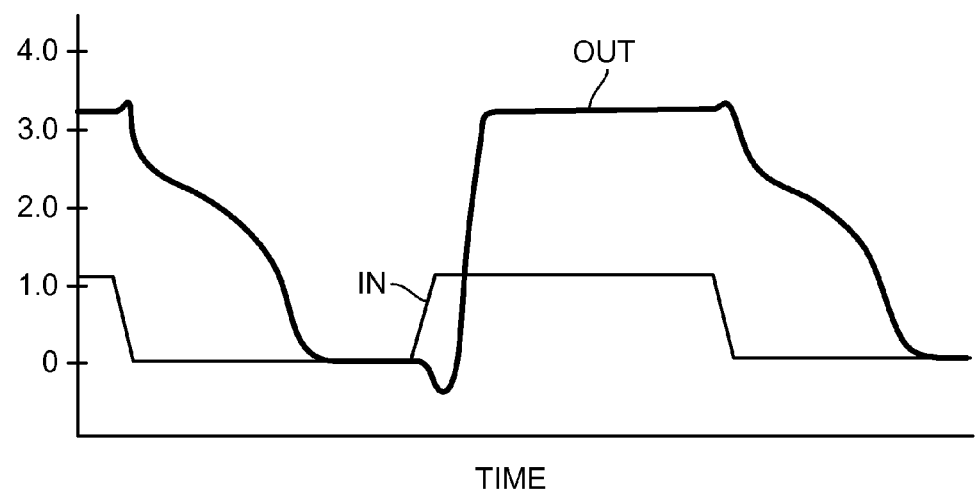
FIG. 1B illustrates the input logic signal and the output logic signal for the circuit of FIG. 1A.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by: specific circuits (e.g., application specific integrated circuits (ASICs)), program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Embodiments provide voltage level shifting for interfacing one voltage domain to another without the contention issues discussed previously with respect to conventional voltage level shifters.

Embodiments may find application in low power, ultra low-voltage, or wide operating voltage range circuits. Such applications may include wearable electronics, low power sensors, and other low power devices that are marketed as the "Internet-of-things." For example, some devices include a low voltage DSP (Digital Signal Processor) or microprocessor core, and a higher voltage domain circuit in communication with the processor, such as a memory or a controller chip for a Bluetooth® Low Energy (BLE) device. (Bluetooth is a registered trademark of the Bluetooth Special Interest Group (SIG), incorporated in Delaware, with global headquarters in Kirkland, Wash.)

Figure 2:
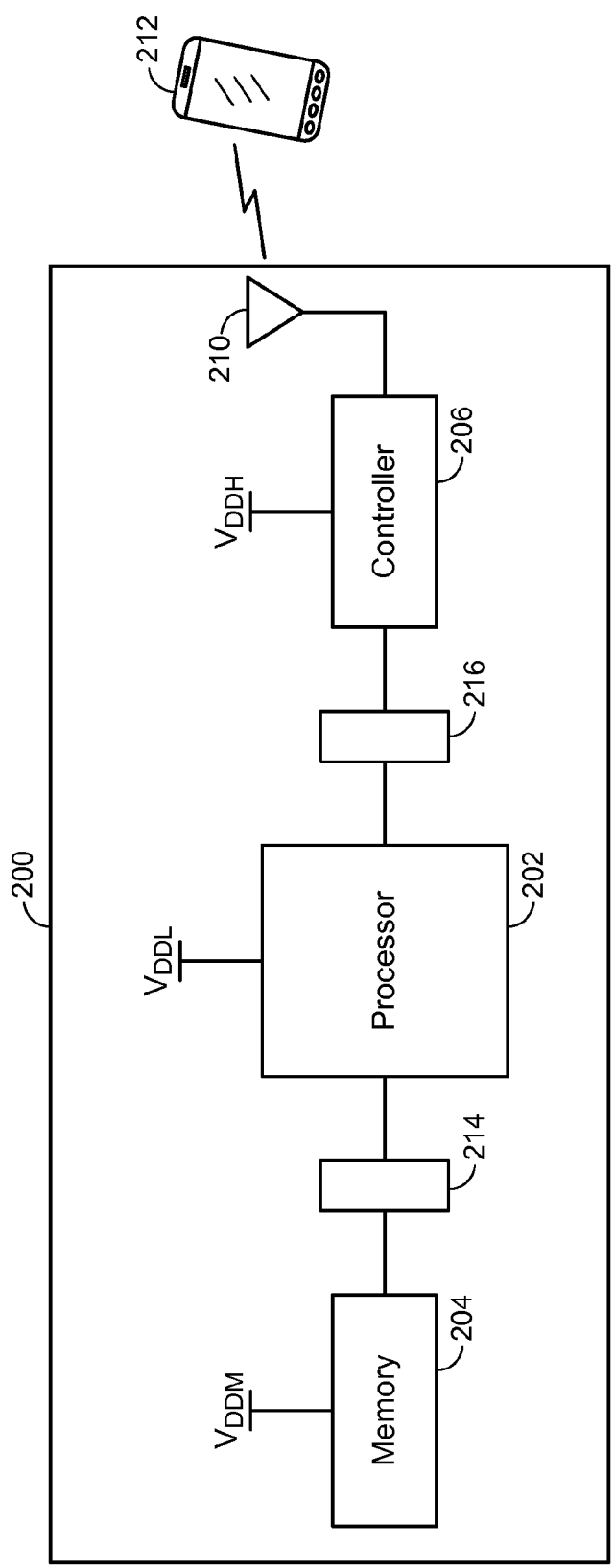
FIG. 2 illustrates an application of an embodiment to a wireless device.

FIG. 2 illustrates an example where the device 200 comprises the processor 202, operating in a first voltage domain, in communication with a memory 204 and a controller 206. The voltage $V_{DDL}$ represents the HIGH voltage within the first voltage domain. The controller 206 operates in a second voltage domain with HIGH voltage $V_{DDH}$, and the memory 204 operates in a third voltage domain with HIGH voltage $V_{DDM}$. The controller 206 may drive an RF (Radio Frequency) antenna to provide a wireless connection with another device, such as for example the smartphone 212. The voltage level shifter 214 provides an interface from the processor 202 to the memory 204, and the voltage level shifter 216 provides an interface from the processor 202 to the controller 206. Some or all of the components illustrated in FIG. 2 may reside on the same chip. For some embodiments, the processor 202 may include multiple processors.

In the embodiments described below, the processor 202 may perform some or all of the actions of the described embodiments under control of software instructions stored in and loaded from the memory 204.

Figure 3:
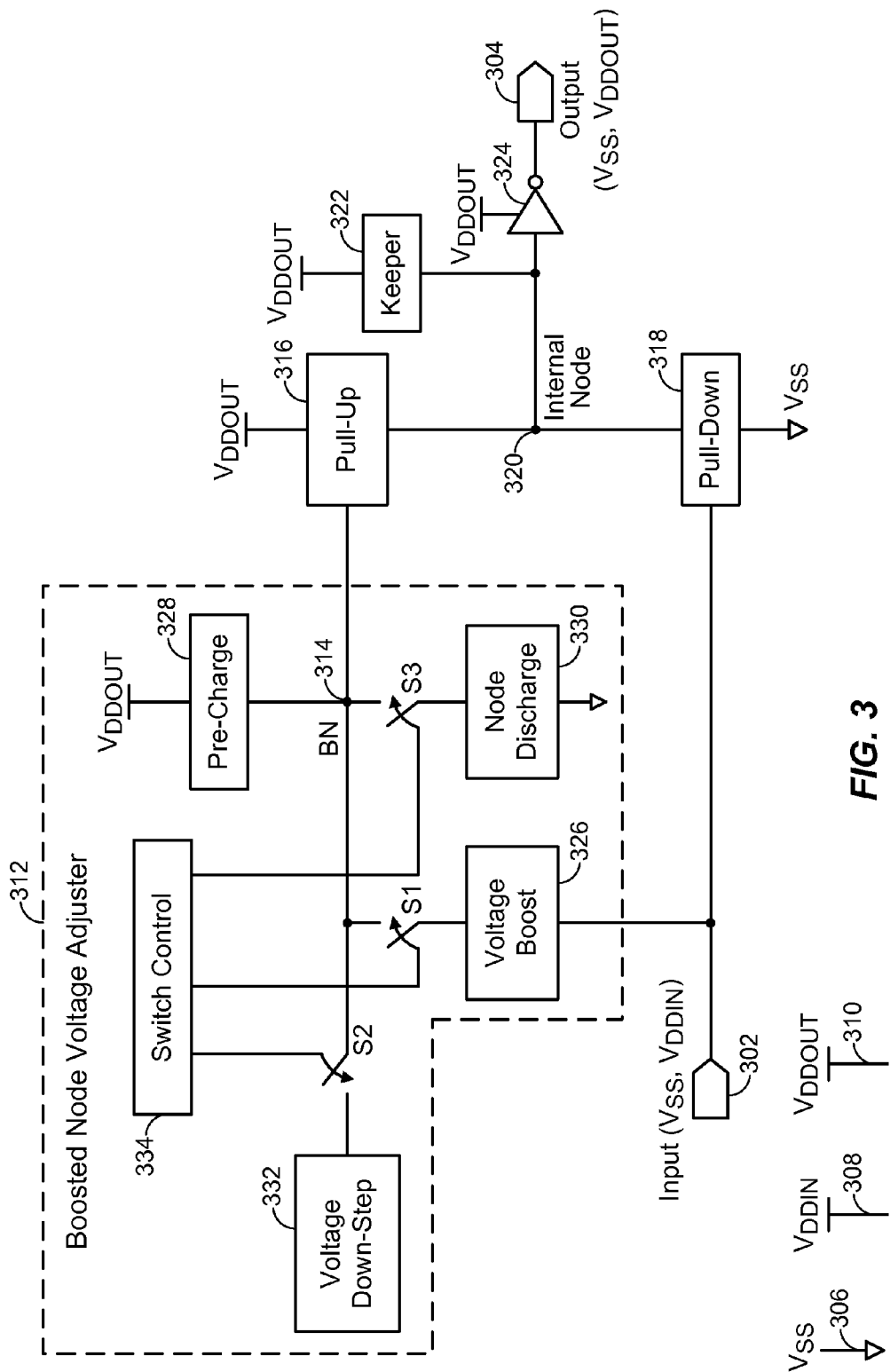
FIG. 3 is a voltage level shifter according to an embodiment.

Referring to the embodiment of FIG. 3, an input logic signal is provided at the input port 302 having a first voltage domain. In response to the input logic signal, the output port 304 provides an output logic signal at a second voltage domain. The voltage levels of the first voltage domain are $V_{SS}$ and $V_{DDIN}$, and the voltage levels of the second voltage domain are $V_{SS}$ and $V_{DDOUT}$, where $V_{DDOUT}$ is greater than $V_{DDIN}$. The voltage $V_{SS}$ may be referred to as the substrate voltage or ground. Accordingly, the power rails 306 and 308 define the first voltage domain, and the power rails 306 and 310 define the second voltage domain.

When the input logic signal at the input port 302 is HIGH for the first voltage domain ($V_{DDIN}$), the boosted node voltage adjuster 312 drives the boosted node 314 to a voltage sufficiently close to HIGH for the second voltage domain, $V_{DDOUT}$, such that the pull-up module 316 is in an OFF state. With the input logic signal HIGH, the pull-down module 318 is driven to an ON state to pull the internal node 320 toward LOW ($V_{SS}$).

When the input logic signal at the input node 302 is LOW, the pull-down module 318 is driven to an OFF state, and the boosted node voltage adjuster 312 is configured so that the pull-up module 316 is driven to an ON state. The pull-up module 316 then drives the internal node 320 toward HIGH ($V_{DDOUT}$) in the second voltage domain.

For some embodiments, a keeper 322 is coupled to the internal node 320 to hold its voltage HIGH ($V_{DDOUT}$) after the pull-up module 316 drives the internal node 320 toward HIGH. As shown in the embodiment of FIG. 3, the internal node 320 is coupled to the input port of an output driver 324. The output driver 324 drives the output port 304 to provide the output logic signal at the second voltage domain, so that when the input logic signal is LOW the output port 304 is driven LOW, and when the input logic signal is HIGH ($V_{DDIN}$) the output port 304 is driven HIGH ($V_{DDOUT}$). Other circuits (not shown) do not appreciably load the output port 304 provided the output impedance of the output driver 324 is sufficiently low.

In the embodiment of FIG. 3, the boosted node voltage adjuster 312 is shown as comprising several modules (sub-circuits) and switches. The voltage boost module 326 and the pre-charge module 328 work in conjunction to provide a boosted voltage to the boosted node 314, so that when the input logic signal to the input port 302 transitions from LOW to HIGH ($V_{DDIN}$) the switch S1 is ON (closed) and the boosted voltage is sufficient to drive the pull-up module 316 to an OFF state.

When the input logic signal transitions from HIGH ($V_{DDIN}$) to LOW, the switch S1 is OFF (opened) and the switch S3 is ON (closed) so that the node discharge module 330 brings the boosted node 314 to a sufficiently low voltage to drive the pull-up module 316 to an ON state. The switch S3 need not stay closed for the entire time interval that the input logic signal is LOW, so that the pre-charge module 328 may pre-charge the boosted node 314 for some time interval when the input logic signal is LOW. The boosted node 314 is pre-charged sufficiently so that when at a later time the input logic signal transitions from LOW to HIGH ($V_{DDIN}$), the boosted node 314 is driven sufficiently toward HIGH ($V_{DDOUT}$) in the second voltage domain to drive the pull-up module 316 into an OFF state as discussed above.

The voltage down-step module 332 is coupled to the boosted node 314 by way of the switch S2. When the switch S1 is ON, the switch S2 is OFF (opened). When the switch S1 is OFF, the switch S2 is ON so as to prevent the pre-charge module 328 from overcharging the boosted node 314. In this way, when the input logic signal transitions from LOW to HIGH, the boosted node 314 is prevented from having a voltage greater than $V_{DDOUT}$, so as not to damage the pull-up module 316. Some embodiments may not include the voltage down-step module 332, and some embodiments may not keep the switch S2 ON for the entire time interval for which the input logic signal is LOW.

The switch control module 334 provides the timing signals to the three switches. Although not shown, the input port 302 may be coupled to the switch control module 334 so that the timing of the switches may depend upon the input logic signal.

Figure 4:
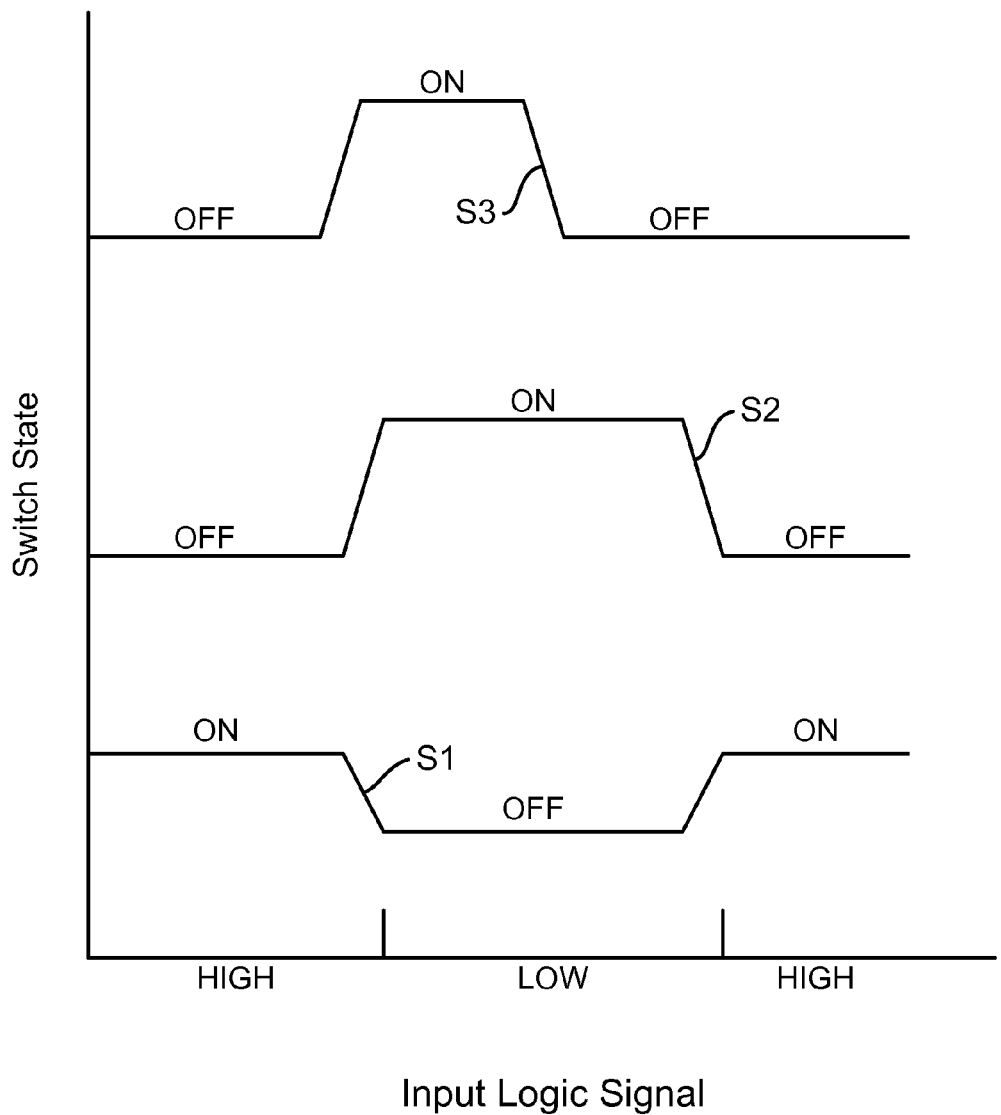
FIG. 4 is a timing diagram for the switches illustrated in the circuit of FIG. 3.

FIG. 4 illustrates a timing diagram for the three switches shown in FIG. 3. The timing diagram is shown for two logic transitions of the input logic signal, a first transition from HIGH to LOW, and a second transition from LOW to HIGH. For the time interval in which the input logic signal is shown as HIGH before the first transition, the switch S1 is closed, and the switches S2 and S3 are opened. When the input logic signal transitions from HIGH to LOW, the switch S1 is opened and the switches S2 and S3 are both closed.

Note that in the particular embodiment of FIG. 4, the switch S3 is closed only for a time interval less than the length of time which the input logic signal is LOW. This is so that the pre-charge module 328 may begin to pre-charge the boosted node 314 in anticipation of the next transition in which the input logic signal goes HIGH. When the input logic signal begins the next transition in which it transitions from LOW to HIGH, the switch S1 is closed and the switch S2 is opened, and the switch S3 is kept in the open state.

The timing diagram illustrated in FIG. 4 shows sharp state transitions for the three switches. Such state transitions may be simplifications of actual circuit behavior. Some of these switches in a particular embodiment may not actually be realized as explicit switches, but instead their functions may be realized by various connections of circuit elements, and there may not be sharp transitions from a closed (ON) state to an opened (OFF) state or from an opened state to a closed state. This is illustrated by considering the embodiment of FIG. 5.

For ease of discussion, for the moment ignore the presence of the capacitor C2 and consider the case in which the input logic signal is held LOW for some time interval so that the bottom terminal of the capacitor C1 is at ground voltage $V_{SS}$. If the voltage at the boosted node 314 started at a sufficiently low voltage so that the pMOSFET MP1 is ON, then the pMOSFET MP1 will charge the boosted node 314 to within a transistor threshold voltage of $V_{DDOUT}$. Accordingly, the pMOSFET MP1 may be identified with the pre-charge module 328. Now, if the input logic signal transitions from LOW to HIGH, just after this transition the voltage at the boosted node 314 would then be the sum of $V_{DDIN}$ and the voltage to which the capacitor C1 had been charged to by the pMOSFET MP1 (which may be referred to as a pre-charge voltage). But this boosted voltage may be too high in some instances. Accordingly, the embodiment illustrated in FIG. 5 includes the capacitor C2 coupled to the boosted node 314 by way of the pMOSFET MP2 to prevent the boosted node 314 from being overcharged.

Again, considering the case in which the input logic signal is held LOW for some time interval but now where the presence of the capacitor C2 is not ignored, the pMOSFET MP1 will charge both the capacitor C1 and the capacitor C2 because the pMOSFET MP2 is ON while the input logic signal is LOW. By appropriately choosing the size of the capacitor C2, the voltage to which the boosted node 314 is charged may be prevented from becoming too high. In this way, when the input logic signal transitions from LOW to HIGH, the voltage at the boosted node 314 will not be too high for the pull-up pMOSFET 502.

When the input logic signal is HIGH, the pull-down nMOSFET 504 is turned ON so that the internal node 320 is pulled toward LOW ($V_{SS}$). As a result, the output driver 324 drives the output node 304 HIGH ($V_{DDOUT}$). Note that when the input logic signal is HIGH, the nMOSFET MN1 is ON and the pMOSFET MP2 is OFF. As a result, the capacitor C2 is decoupled from the boosted node 314 and is discharged by way of the nMOSFET MN1. In this way, the capacitor C2 is ready to be charged by the pMOSFET MP1 at the next transition when the input logic signal goes from HIGH to LOW.

Figure 5:
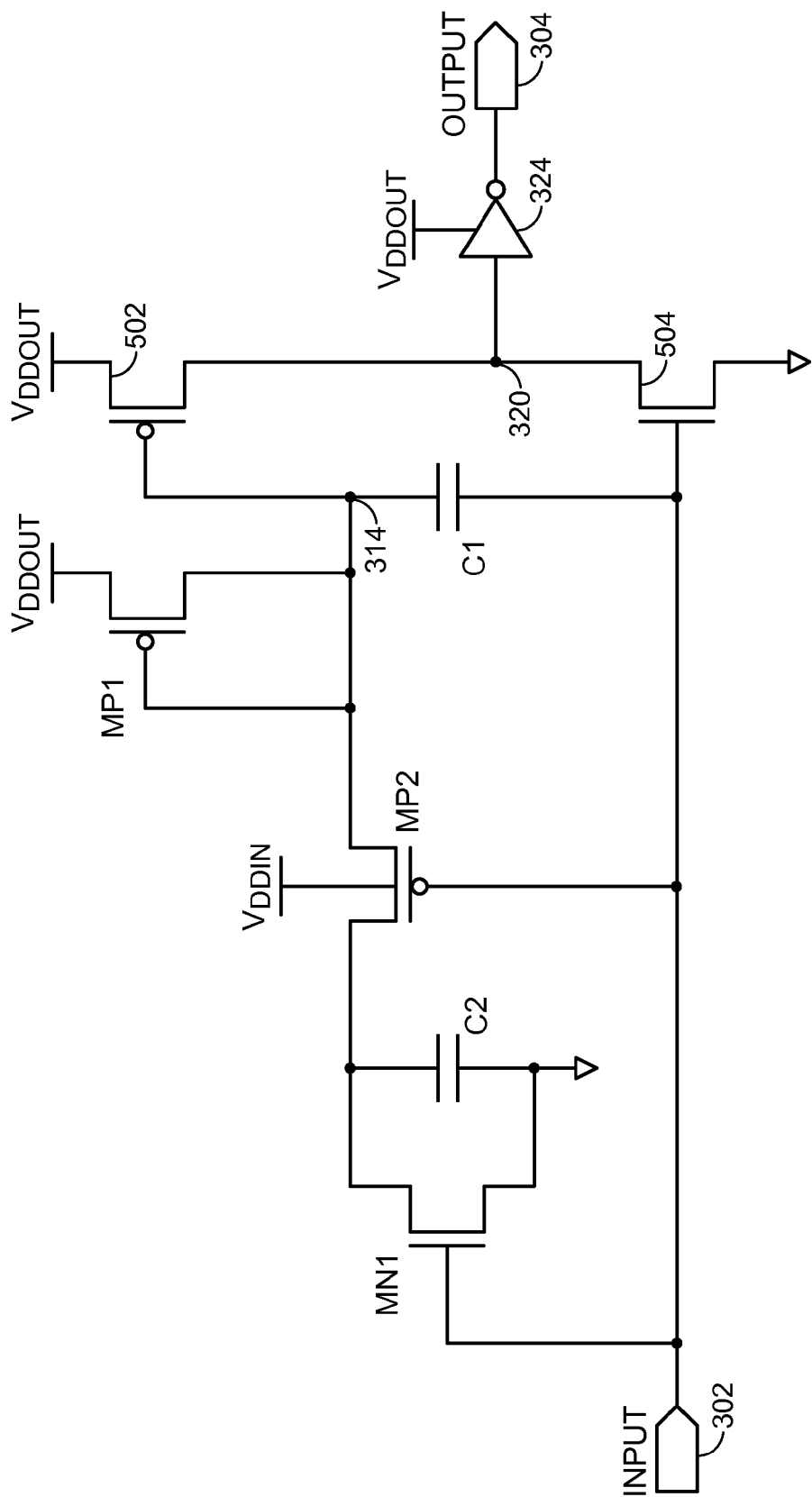
FIG. 5 is a circuit realization of the embodiment of FIG. 3 according to an embodiment.

Accordingly, in light of the above discussion, in comparing FIG. 5 with FIG. 3, the pMOSFET MP2 may be identified with the switch S2 and the capacitor C2 may be identified with the voltage down-step module 332. The pMOSFET MP1 may be identified with the pre-charge module 328, the pull-up pMOSFET 502 may be identified with the pull-up module 316, and the pull-down nMOSFET 504 may be identified with the pull-down module 318.

However, the capacitor C1 and the way in which it is connected in the circuit of FIG. 5 effectively realizes the functions of the switches S1 and S3 as well as the functions represented by the voltage boost module 326 and the node discharge module 330. That is, when the input logic signal goes from LOW to HIGH, the voltage to which the capacitor C1 has been charged is now added to $V_{SS}$ to provide the voltage at the boosted node 314. This achieves the function of closing the switch S1 so that the voltage boost module 326 may boost the voltage of the boosted node 314. When the input logic signal goes from HIGH to LOW, the capacitor C1 acts as a high pass filter and so the effect of this transition lowers the voltage of the boosted node 314, so that this action achieves the function of closing the switch S1 so that the node discharge module 330 may discharge the boosted node 314 as indicated in FIG. 3.

Therefore, it is to be appreciated that embodiments may realize the functional relationships as indicated by the various switches and components illustrated in FIG. 3 without necessarily requiring actual explicit realizations of some of these switches and functional units. For example, as discussed with respect to FIG. 5, the capacitor C1 in effect performs the functions indicated by the voltage boost module 326, the node discharge module 330, and the switches S1 and S3.

Figure 6:
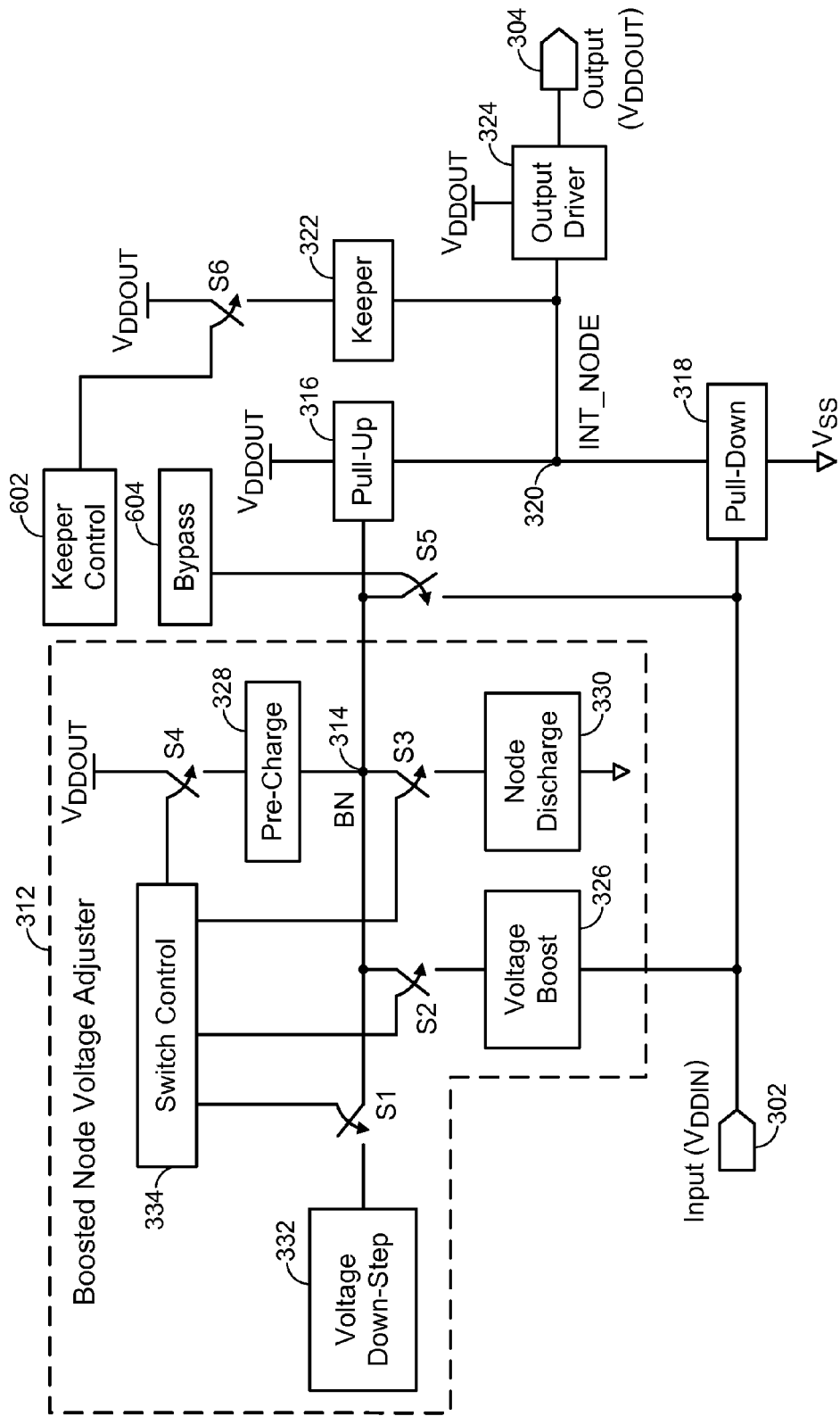
FIG. 6 is a voltage level shifter according to another embodiment.

FIG. 6 illustrates another embodiment. Many of the components appearing in FIG. 6 are the same as in FIG. 3 and therefore need not be explained in detail. New components in FIG. 6 not shown in FIG. 3 include the keeper control module 602, the bypass module 604, and three additional switches: S4, S5, and S6. The added switches in FIG. 6 decouple the boosted node voltage adjuster 312 and other components from the voltage level shifter when the logic level for the input logic signal is sufficiently high such that voltage boosting is not needed.

For example, if $V_{DDIN}$ is sufficiently high so as to properly drive OFF the pull-up module 316 without the need for voltage boosting, then the bypass module 604 closes the switch S5 so that the input port 302 is coupled directly to the pull-up module 316 and the pull-down module 318. This situation may be termed the bypass mode. In the bypass mode, the remaining switches shown in FIG. 6 are kept open so as not to unnecessarily consume power. When not in the bypass mode, the switch S5 is opened, and the switches S4 and S6 are closed. The switches S1, S2, and S3 operate as in FIG. 3 when not in the bypass mode. Note that for some embodiments, the switch S4 may be closed only when the boosted node 314 needs to be pre-charged.

Figure 7:
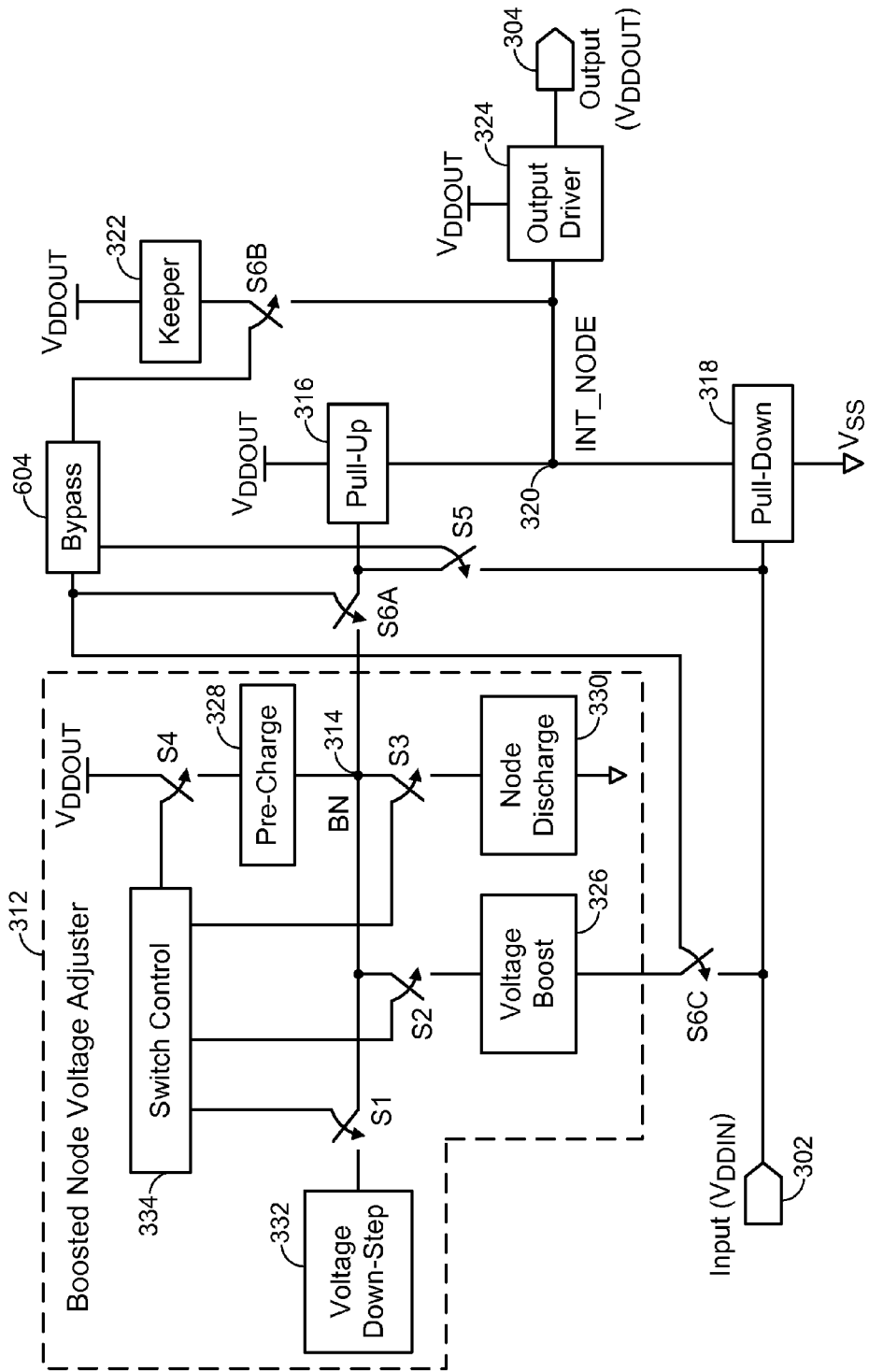
FIG. 7 is a voltage level shifter according to another embodiment.

FIG. 7 illustrates another embodiment. In comparing the circuit in FIG. 7 to that of FIG. 6, note that the switches S6A and S6B are introduced. Also, instead of the switch S6 in FIG. 6 used with the keeper 322, the switch S6B is used instead to decouple the keeper 322 from the voltage level shifter. When in the bypass mode, the switch S5 is closed and the switches S6A, S6B, and S6B are opened. When not in the bypass mode (the regular operating mode), the switch S5 is opened and the switches S6A, S6B, and S6C are closed. The remaining switches operate as discussed with respect to FIG. 6. By using the switches S6A, S6B, and S6C, the boosted node voltage adjuster 312 and the keeper 322 are decoupled from the circuit during the bypass mode so as not to unnecessarily load the voltage level shifter.

Figure 8:
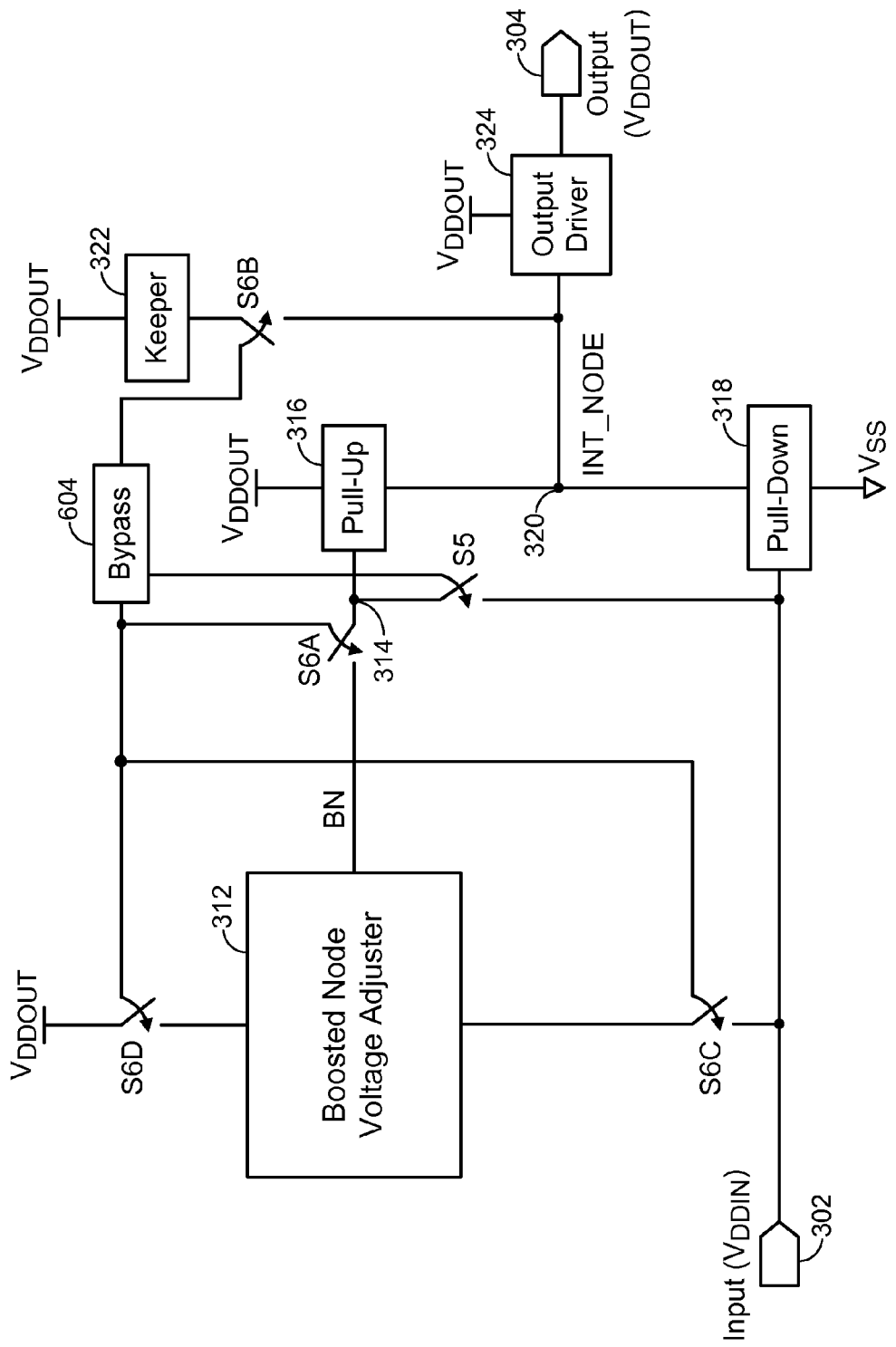
FIG. 8 is a voltage level shifter according to another embodiment.

FIG. 8 provides another embodiment, where for ease of illustration the individual components making up the boosted node voltage adjuster 312 are not shown. In addition to the switches as illustrated in FIG. 7, FIG. 8 includes the switch S6D. All the switches shown in FIG. 8 except for the switch S5 are opened when the voltage level shifter is in the bypass mode, and the same switches are closed when the voltage level shifter is in its normal operating mode (where the switch S5 is opened). The addition of the switch S6D in FIG. 8 as compared to the embodiment of FIG. 7 helps to mitigate leakage current. With the switches S6A, S6C, and S6D opened, the boosted node voltage adjuster 312 is not only decoupled from the voltage level shifter but is also decoupled from all power rails.

Figure 9:
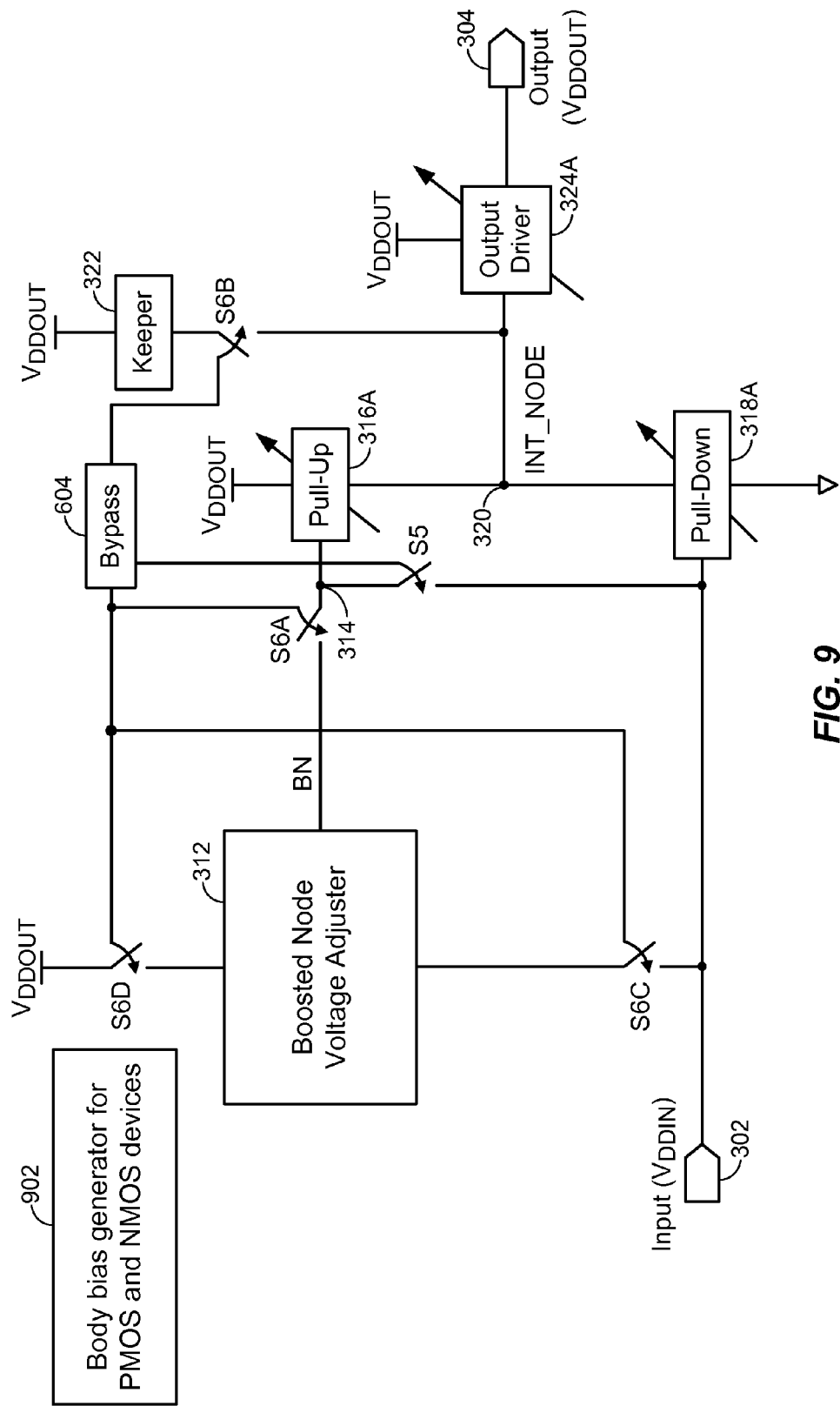
FIG. 9 is a voltage level shifter according to another embodiment.

FIG. 9 illustrates another embodiment, and includes the same configuration of switches as indicated in FIG. 8. The switches illustrated in FIG. 9 operate in the same manner as their corresponding counterparts in the embodiment of FIG. 8. The embodiment of FIG. 9 includes a pull-up module 316A and a pull-down module 318A that provide the same functions as the pull-up module 316 and the pull-down module 318, respectively, but where their strengths are programmable (tunable) as indicated by the arrows. The output driver 324A is similar in function to the output driver 324, but with programmable (tunable) strength. The tunable pull-up module 316A, tunable pull-down module 318A, and tunable output driver 324A enable balancing signal delays in transition times across different PVT. Some embodiments may also include the body bias generator 902 to provide a body bias to one or more of the transistors in an embodiment to further reduce leakage current as well as process variability.

Figure 10:
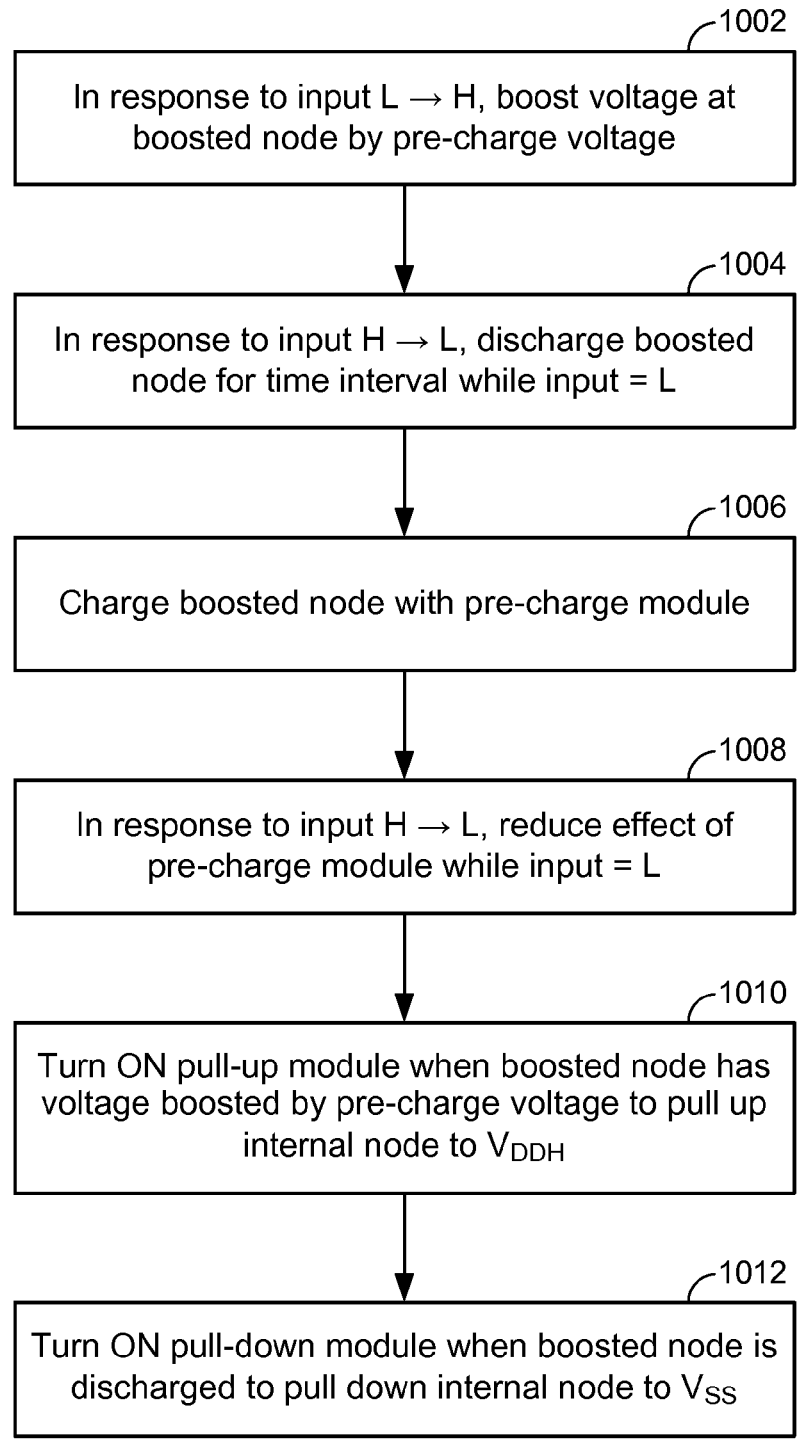
FIG. 10 is a flow diagram illustrating steps for voltage level shifting according to an embodiment.

FIG. 10 is a flow diagram illustrating steps according to an embodiment. These steps may be implemented in a hardwired circuit, such as one of the circuits discussed previously, or the steps (or some of the steps) may be implemented by a processor according to instructions stored and loaded from memory, as discussed with respect to FIG. 2. (A memory, such as for example the memory 204, may be referred to as a non-transitory computer-readable medium.)

The order of the steps as they appear in FIG. 10 is for ease of discussion, and does not necessarily imply any specific ordering of the actions in an embodiment. In step 1002, in response to the input logic signal transitioning from LOW ($V_{SS}$) to HIGH ($V_{DDIN}$), an embodiment boosts the boosted node by a pre-charge voltage. For example, referring to FIG. 5, the pre-charge voltage is the voltage to which the capacitor C1 is charged while the input port 302 is LOW.

In step 1004, in response to the input logic signal transitioning from HIGH to LOW, the boosted node is discharged for some time interval while the input logic signal is LOW. This corresponds to FIG. 4, which shows that the switch S3 transitions from an OFF state to an ON state in response to the input logic signal transitioning from HIGH to LOW, where the time interval for which the switch S3 is ON may be less than the length of time for when the input logic signal is held LOW.

In step 1006, a pre-charge module pre-charges the boosted node. For example, in FIG. 3 the pre-charge module 328 is coupled to the boosted node 314 independently of whether the input logic signal is HIGH or LOW. As discussed with respect to FIG. 3, the voltage down-step module 332 prevents the boosted node 314 from being charged too high. This is reflected in the step 1008, where in response to the input logic signal transitioning from HIGH to LOW, the effect of the pre-charge module is reduced while the input logic signal is LOW.

In step 1010, a pull-up module (e.g., the pull-up module 316) is turned ON in response to the boosted node having its voltage boosted by the pre-charge module, so that the internal node is pulled up in voltage toward $V_{DDOUT}$. In step 1012, a pull-down module (e.g., the pull-down module 318) is turned ON when the boosted node is discharged in response to the input logic signal transitioning from LOW to HIGH, so that the internal node is pulled down toward $V_{SS}$.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for level voltage shifting with built-in voltage boosting and down-stepping assisting. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A voltage level shifter comprising
a boosted node having a voltage;
an input port to receive an input logic signal in a first voltage domain;
an output port to provide an output logic signal in a second voltage domain in response to the input logic signal;
a voltage boost module coupled to the boosted node to boost the voltage of the boosted node when the input logic signal transitions from a LOW voltage to a first HIGH voltage in the first voltage domain;
a node discharge module coupled to the boosted node to discharge the boosted node for a time interval when the input logic signal transitions from the first HIGH voltage to the LOW voltage; and
a pull-up module coupled to the boosted node, the boosted node to turn OFF the pull-up module when boosted by the voltage boost module, wherein the pull-up module operates in the second voltage domain.

2. The voltage level shifter of claim 1, further comprising:
an internal node coupled to the pull-up module, the pull-up module to pull the internal node toward a second HIGH voltage in the second voltage domain when ON; and
a pull-down module coupled to the input port to turn ON when the input logic signal transitions from the LOW voltage to the first HIGH voltage, the pull-down module coupled to the internal node to pull the internal node to the LOW voltage when ON.

3. The voltage level shifter of claim 2, further comprising:
an output driver coupled to the internal node and to the output port to drive the output logic signal to the second HIGH voltage when the pull-up module is OFF and to drive the output logic signal to the LOW voltage when the pull-down module is ON.

4. The voltage level shifter of claim 3, further comprising:
a pre-charge module coupled to the boosted node to charge the boosted node.

5. The voltage level shifter of claim 4, further comprising:
a voltage down-step module coupled to the boosted node to receive charge from the pre-charge module when the input logic signal transitions from the first HIGH voltage to the LOW voltage.

6. The voltage level shifter of claim 1, further comprising:
a pre-charge module coupled to the boosted node to charge the boosted node.

7. The voltage level shifter of claim 6, further comprising:
a voltage down-step module coupled to the boosted node to receive charge from the pre-charge module when the input logic signal transitions from the first HIGH voltage to the LOW voltage.

8. The voltage level shifter of claim 1, wherein the time interval is less than a length of time when the input logic signal is at the LOW voltage.

9. The voltage level shifter of claim 1, wherein the voltage boost module and the node discharge module together comprise a first capacitor having a first terminal coupled to the input port and a second terminal coupled to the boosted node.

10. The voltage level shifter of claim 9, further comprising:
a pre-charge module coupled to the boosted node to charge the boosted node; and
a voltage down-step module coupled to the boosted node to receive charge from the pre-charge module when the input logic signal transitions from the first HIGH voltage to the LOW voltage.

11. The voltage level shifter of claim 10, wherein the voltage down-step module comprises a second capacitor coupled to the boosted node by way of a switch, the switch turned ON when the input logic signal transitions from the first HIGH voltage to the LOW voltage.

12. The voltage level shifter of claim 11, further comprising:
an internal node coupled to the pull-up module, the pull-up module to pull the internal node toward a second HIGH voltage in the second voltage domain when ON;
a pull-down module coupled to the input port to turn ON when the input logic signal transitions from the LOW voltage to the first HIGH voltage, the pull-down module coupled to the internal node to pull the internal node to the LOW voltage when ON; and an output driver coupled to the internal node and to the output port to drive the output logic signal to the second HIGH voltage when the pull-up module is OFF and to drive the output logic signal to the LOW voltage when the pull-down module is ON.

13. The voltage level shifter of claim 12, further comprising:
a power rail at the second HIGH voltage;
a ground rail at the LOW voltage;
wherein the pull-up module comprises a pMOSFET having a gate coupled to the boosted node, a source coupled to the power rail, and a drain coupled to the internal node; and
wherein the pull-down module comprises an nMOSFET having a gate coupled to the input port, a source coupled to the ground rail, and a drain coupled to the internal node.

14. The voltage level shifter of claim 1, further comprising:
at least one switch to decouple the boosted node from the pull-up module and to directly couple the pull-up module to the input port when in a bypass mode.

15. The voltage level shifter of claim 1, further comprising:
a body bias generator to provide a body bias voltage to the voltage boost module and the node discharge module.

16. A method to provide a voltage level shift, the method comprising:
boosting voltage at a boosted node by a pre-charge voltage in response to an input signal going from LOW to HIGH in a first voltage domain;
discharging the boosted node for a time interval in response to the input signal going from HIGH to LOW in the first voltage domain while the input signal is LOW;
charging the boosted node with a pre-charge module;
reducing the effect of the pre-charge module in response to the input signal going from HIGH to LOW in the first voltage domain while the input signal is LOW; and
pulling up an internal node to a HIGH voltage in a second voltage domain in response to boosting voltage at the boosted node to the pre-charge voltage.

17. The method of claim 16, wherein pulling up the internal node to the HIGH voltage in the second voltage domain includes turning ON a pull-up module in the second voltage domain.

18. The method of claim 16, further comprising:
discharging the boosted node; and
pulling down the internal node to LOW in response to the discharging of the boosted node.

19. The method of claim 18, wherein pulling down the internal node to LOW includes turning ON a pull-down module.

20. The method of claim 19, wherein pulling up the internal node to the HIGH voltage in the second voltage domain includes turning ON a pull-up module in the second voltage domain.

21. A system to provide a voltage level shift, the system comprising:
means for boosting voltage at a boosted node by a pre-charge voltage in response to an input signal going from LOW to HIGH in a first voltage domain;
means for discharging the boosted node for a time interval in response to the input signal going from HIGH to LOW in the first voltage domain while the input signal is LOW;
means for charging the boosted node with a pre-charge module;
means for reducing the effect of the pre-charge module in response to the input signal going from HIGH to LOW in the first voltage domain while the input signal is LOW; and
means for pulling up an internal node to a HIGH voltage in a second voltage domain in response to boosting voltage at the boosted node to the pre-charge voltage.

22. The system of claim 21, wherein the means for pulling up the internal node to the HIGH voltage in the second voltage domain includes turning ON a pull-up module in the second voltage domain.

23. The system of claim 21, further comprising:
means for discharging the boosted node; and
means for pulling down the internal node to LOW in response to discharging of the boosted node.

24. The system of claim 23, wherein the means for pulling down the internal node to LOW includes turning ON a pull-down module.

25. The system of claim 21, wherein the system includes a cellular phone having a processor operating in the first voltage domain and a memory operating in the second voltage domain.

* * * * *